US012640724B2

(12) United States Patent
Nishitani

(10) Patent No.: US 12,640,724 B2
(45) Date of Patent: May 26, 2026

(54) OVERVOLTAGE PROTECTION CIRCUIT, CONNECTOR, AND SEMICONDUCTOR DEVICE

(71) Applicant: Renesas Electronics Corporation, Tokyo (JP)

(72) Inventor: Tomoya Nishitani, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 163 days.

(21) Appl. No.: 18/581,571

(22) Filed: Feb. 20, 2024

(65) Prior Publication Data

US 2024/0297644 A1 Sep. 5, 2024

(30) Foreign Application Priority Data

Mar. 1, 2023 (JP) ................................. 2023-031194

(51) Int. Cl.
 *H03K 17/0814* (2006.01)
 *H03K 17/687* (2006.01)
(52) U.S. Cl.
 CPC ..... *H03K 17/08142* (2013.01); *H03K 17/687* (2013.01); *H03K 2217/0081* (2013.01)
(58) Field of Classification Search
 CPC ........... H03K 17/08142; H03K 17/687; H03K 2217/0081; H03K 17/08104; H02H 3/20; H02H 9/04; H01R 13/6666
 USPC .................................................... 361/18, 56
 See application file for complete search history.

(56) References Cited

U.S. PATENT DOCUMENTS

| | | | | |
|---|---|---|---|---|
| 5,864,245 A | * | 1/1999 | Watarai ................ | H03K 17/145 |
| | | | | 326/86 |
| 10,218,129 B1 | * | 2/2019 | Mondal ............... | G06F 13/4282 |
| 11,133,663 B2 | * | 9/2021 | Hanagami ............... | G05F 1/575 |
| 2012/0206846 A1 | * | 8/2012 | Sushihara .............. | H02H 9/046 |
| | | | | 361/91.5 |
| 2020/0373756 A1 | * | 11/2020 | Cheng .................... | H02H 9/041 |
| 2022/0107345 A1 | * | 4/2022 | Nakagawa ....... | H03K 19/00315 |

OTHER PUBLICATIONS

Universal Serial Bus Type-C Cable and Connector Specification , Release 2.2, Oct. 2022, 446 pages.

* cited by examiner

*Primary Examiner* — Sreeya Sreevatsa
(74) *Attorney, Agent, or Firm* — SCULLY, SCOTT, MURPHY & PRESSER, P.C.

(57) ABSTRACT

An overvoltage protection circuit is provided. The overvoltage protection circuit includes: a current output circuit including a first transistor arranged between a power supply and a CC terminal and a second transistor arranged between the first transistor and the CC terminal, the current output circuit outputting the current to the first transistor to be driven such that a current flows from the power supply; and a gate input circuit controlling a voltage of a gate and a voltage of a back gate of the second transistor, the gate input circuit controls the voltage of the gate and the voltage of the back gate of the second transistor in response to a voltage applied to the CC terminal, and the current output circuit protects the first transistor from the voltage applied to the CC terminal under control of the second transistor.

16 Claims, 12 Drawing Sheets

OVERVOLTAGE PROTECTION CIRCUIT, CONNECTOR, AND SEMICONDUCTOR DEVICE

CROSS-REFERENCE TO RELATED APPLICATION

This application claims priority under 35 U.S.C. § 119 to Japanese Patent Application No. 2023-031194 filed on Mar. 1, 2023. The disclosure of Japanese Patent Application No. 2023-031194, including the specification, drawings and abstract is incorporated herein by reference in its entirety.

BACKGROUND

The present disclosure relates to an overvoltage protection circuit, a connector, and a semiconductor device.

There is disclosed technique listed below.

[Non-Patent Document 1] "Universal Serial Bus Type-C Cable and Connector Specification Release 2.2", [online], on Oct. 18, 2022, [searched on Jan. 5, 2023], Internet <https://www.usb.org/document-library/usb-type-cr-cable-and-connector-specification-release-22>

The Non-Patent Document 1 describes a Type-C connector as a standard that has appeared for the purpose of unifying a plurality of existing universal serial bus (hereinafter referred to as USB) connector shapes.

SUMMARY

When a circuit compatible with the Type-C connector is formed, there is a concern about an increase in manufacturing costs.

Other problems and novel characteristics will be apparent from the description of the present specification and the accompanying drawings.

According to an embodiment, an overvoltage protection circuit includes: a current output circuit and a gate input circuit, the current output circuit including a first transistor arranged between a power supply and a terminal and a second transistor arranged between the first transistor and the terminal, the current output circuit outputting the current to the first transistor to be driven such that a current flows from the power supply, and the gate input circuit controlling a voltage of a gate and a voltage of a back gate of the second transistor, and the gate input circuit controls the voltage of the gate and the voltage of the back gate of the second transistor in response to a voltage applied to the terminal, and the current output circuit protects the first transistor from the voltage applied to the terminal under control of the second transistor.

According to an embodiment, a connector includes a CCPHY, the CCPHY includes an overvoltage protection circuit, and the overvoltage protection circuit includes: a current output circuit and a gate input circuit, the current output circuit including a first transistor arranged between a power supply and a terminal and a second transistor arranged between the first transistor and the terminal, the current output circuit outputting the current to the first transistor to be driven such that a current flows from the power supply, and the gate input circuit controlling a voltage of a gate and a voltage of a back gate of the second transistor, and the gate input circuit controls the voltage of the gate and the voltage of the back gate of the second transistor in response to a voltage applied to the terminal, and the current output circuit protects the first transistor from the voltage applied to the terminal under control of the second transistor.

According to an embodiment, a semiconductor device includes an overvoltage protection circuit, the overvoltage protection circuit includes: a current output circuit and a gate input circuit, the current output circuit including a first transistor arranged between a power supply and a terminal and a second transistor arranged between the first transistor and the terminal, the current output circuit outputting the current to the first transistor to be driven such that a current flows from the power supply, and the gate input circuit controlling a voltage of a gate and a voltage of a back gate of the second transistor, and the gate input circuit controls the voltage of the gate and the voltage of the back gate of the second transistor in response to a voltage applied to the terminal, and the current output circuit protects the first transistor from the voltage applied to the terminal under control of the second transistor.

According to the embodiments, an overvoltage protection circuit, a connector, and a semiconductor device each capable of reducing manufacturing costs can be provided.

BRIEF DESCRIPTIONS OF THE DRAWINGS

FIG. 2 is a configuration diagram illustrating the connector according to the first comparative example, illustrating a functional model in a case where a sink is connected to a source.

FIG. 13 is a block diagram illustrating the Type-C connector.

DETAILED DESCRIPTION

Figure 1:
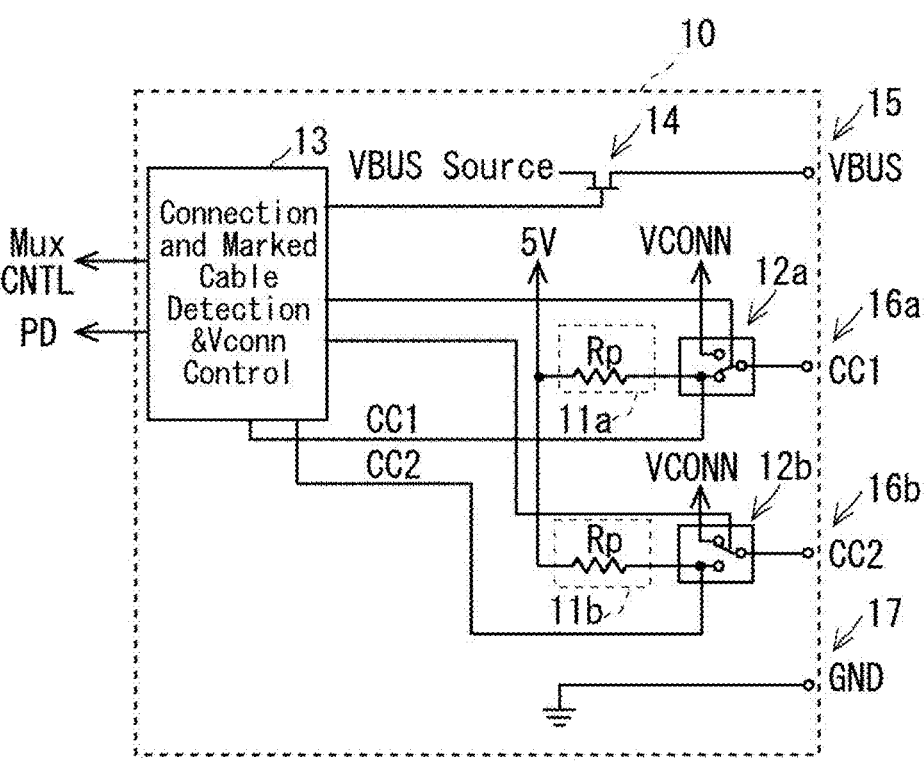
FIG. 1 is a configuration diagram illustrating a connector according to a first comparative example, illustrating a functional model for a source.

For clarity of explanation, the following description and drawings are appropriately omitted and simplified. In the drawings, the same elements are respectively denoted by the same reference symbols, and overlapping description thereof is omitted as needed.

First, in a chapter <Background>, the background of the present disclosure will be described. Then, in a chapter <First Comparative Example>, a connector according to a first comparative example will be described. Then, in a chapter <Problems found by Inventors>, problems of the connector according to the first comparative example found by the inventors will be described. In a chapter <First Embodiment>, <Configuration of Overvoltage Protection Circuit> and <Operation of Overvoltage Protection Circuit> according to the first embodiment will be described.

Then, in a chapter <Second Comparative Example>, a connector according to a second comparative example will be described. Then, in a chapter <Problems found by Inventors>, problems of the connector according to the second comparative example found by the inventors will be described. In a chapter <Second Embodiment>, <Configuration of Overvoltage Protection Circuit> and <Operation of Overvoltage Protection Circuit> according to the second embodiment will be described. The background of the present disclosure, the connectors according to the first comparative example and the second comparative example, and the problems found by the inventors are also within the scope of the technical idea of the embodiments.

BACKGROUND

The present disclosure may be related to, for example, a Type-C compatible PHY (physical layer) that is a function required to achieve a USB Type-C connector. The Type-C compatible PHY is referred to as a CCPHY below.

The Type-C connector is a standard that has appeared for the purpose of unifying a plurality of existing USB connector shapes. When the Type-C connector is mounted, it is unnecessary to distinguish the front side and the rear side in a plug of the connector. Accordingly, connectors are easily connected to each other. The plug and a receptacle of the connector may be merely referred to as a connector. When the Type-C connector is mounted, there are various advantages that more power than the existing one can be supplied and received from a VBUS power supply of USB equipment.

Figure 12:
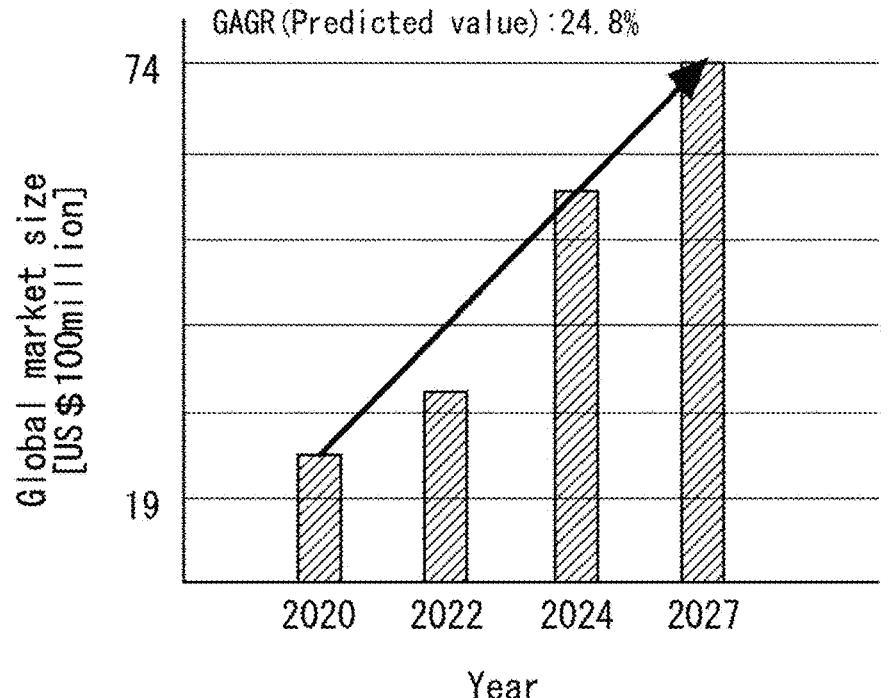
FIG. 12 is a graph illustrating a result of market research of a Type-C connector, where a horizontal axis represents a research year and a vertical axis represents a global market size.

FIG. 12 is a graph illustrating a result of market research of the Type-C connector, where a horizontal axis represents a research year and a vertical axis represents a global market size. As illustrated in FIG. 12, it has been predicted from market research that has been performed in 2021 that an average annual growth rate of the Type-C connector from 2020 to 2027 is 24.8%. A law requiring that terminals for charging and connecting small-sized electronic equipment should be unified to the Type-C connector has been passed in the EU assembly on October, 2022. As a result, it is predicted that the popularization of the Type-C connector is accelerated. Accordingly, there have been increasing needs of an MCU (micro controller unit) product for the Type-C connector.

The present disclosure relates to an overvoltage protection circuit, a connector, and a semiconductor device for each solving, for example, characteristic deterioration and destruction of an internal element due to a current path and an overvoltage to be generated in connection between the CCPHYs having different usage conditions of the power supply voltages from each other.

Figure 13:
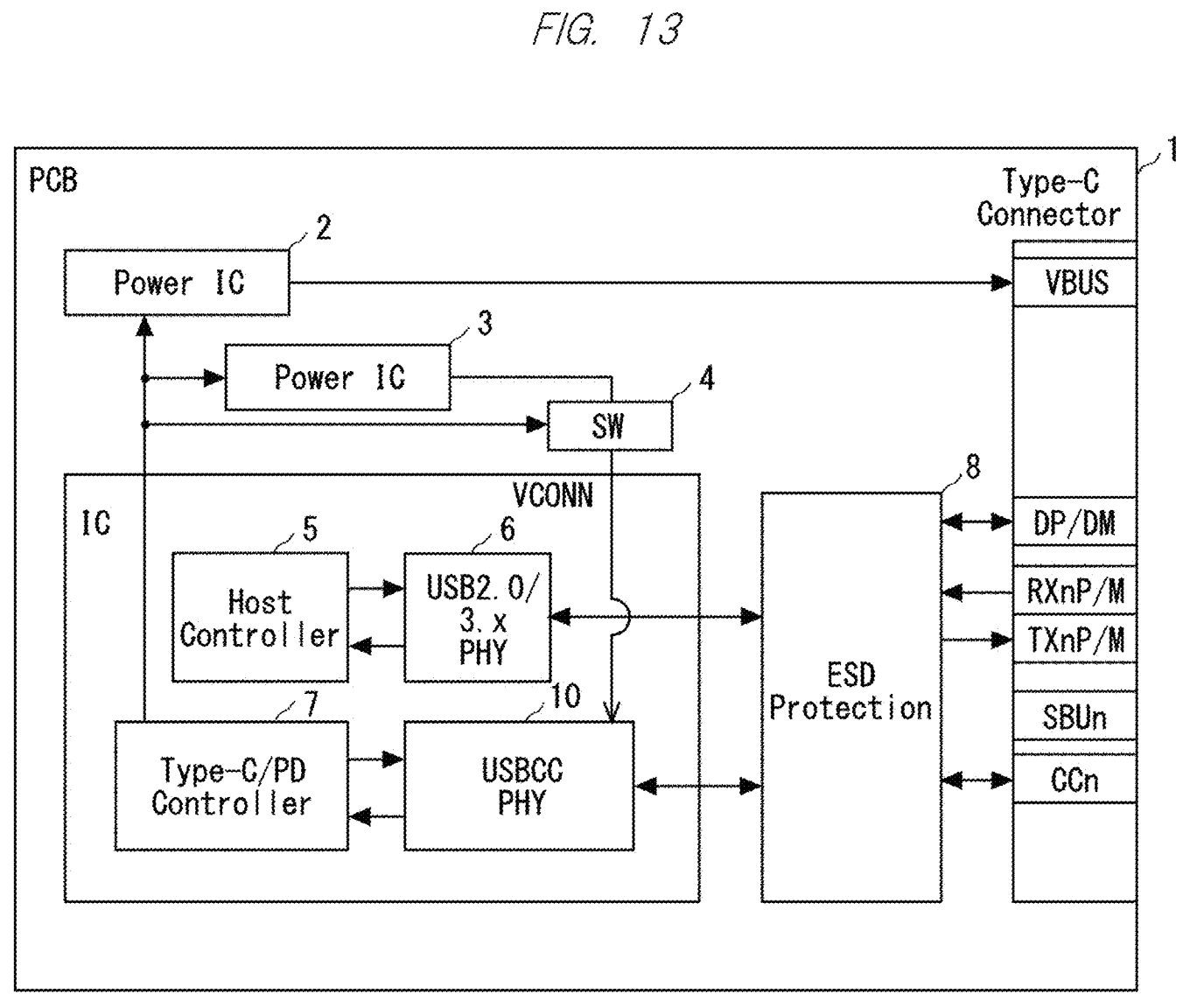

In describing the comparative examples, terms in the Type-C connector will be first described. In the Type-C connector, the power supply side is referred to as a source, and the power reception side is referred to as a sink. FIG. 13 is a block diagram illustrating the Type-C connector. As illustrated in FIG. 13, the Type-C connector 1 includes a power IC2, a power IC3, a switch 4, a host controller 5, a USB 2.0/3.xPHY 6, a TYPE-C/PD controller 7, an ESD protection circuit 8, and a USB CCPHY (hereinafter merely referred to as CCPHY) 10. The Type-C connector 1 may be formed on a printed circuit board PCB.

The power IC2 is connected to a VBUS terminal. The power IC2 is controlled by the TYPE-C/PD controller 7. The power IC2 may have a power supply capability of a maximum of 15 W in non-compatibility with PD (power delivery), or may have a power supply capability of a maximum of 100 W in SRP and a power supply capability of a maximum of 240 W in ERP in compatibility with PD.

The power IC3 is connected to the CCPHY 10 via the switch 4. The power IC3 may supply power of, for example, 600 mA at 5V to the CCPHY 10. The switch 4 switches on and off the power supply from the power IC3 to the CCPHY 10.

The host controller 5, the USB 2.0/3.xPHY 6, the TYPE-C/PD controller 7, and the CCPHY 10 may be formed in an integrated circuit IC.

The host controller 5 is connected to the USB 2.0/3.xPHY 6. The host controller 5 controls an operation of the USB 2.0/3.xPHY 6. The USB 2.0/3xPHY 6 is connected to terminals such as DP/DM, PXnP/M and TXnP/M via the ESD protection circuit 8. The USB 2.0/3.xPHY 6 performs data communication with the outside via the terminals such as DP/DM, RXnP/M, and TXnP/M.

The TYPE-C/PD controller 7 is connected to the CCPHY 10. The TYPE-C/PD controller 7 controls an operation of the CCPHY 10. The ESD protection circuit 8 has a high withstand voltage, and protects an integrated circuit IC from a high voltage to be applied to each of the terminals. The CCPHY 10 is connected to a configuration channel (hereinafter referred to as CC) terminal via the ESD protection circuit 8. The CCPHY 10 detects connection and disconnection of a USB port, determines the front side and the rear side of the connector at the time of connector connection, and notifies and detects a power supply capability of a VBUS power supply via a CC terminal.

Thus, the CCPHY 10 has a different function from that of the USB 2.0/3.xPHY 6 mounted on the existing USB equipment. The CCPHY 10 has a dedicated CC terminal separately from the terminals such as DP/DM used for data communication. The CC terminal may have, for example, a CC1 terminal and a CC2 terminal.

First Comparative Example

Then, a connector according to a first comparative example will be described. The connector in the first comparative example includes, for example, the CCPHY. FIG. 1 is a configuration diagram illustrating the connector according to the first comparative example, illustrating a functional model for the source. A portion surrounded by a dotted line in FIG. 1 represents the CCPHY 10 in the first comparative example. FIG. 1 illustrates, for example, the functional model for the source as described above in the Non-Patent Document.

As illustrated in FIG. 1, the CCPHY 10 for the source includes a pullup (hereinafter referred to as Rp) resistor 11a or a current output circuit, an Rp resistor 11b or a current output circuit, a switch 12a, a switch 12b, a sink and cable connection detector circuit 13, a transistor 14, a VBUS terminal 15, a CC1 terminal 16*a*, a CC2 terminal 16*b*, and a GND terminal 17. Here, a case of the Rp resistor 11*a* of the Rp resistor 11*a* or the current output circuit is illustrated. Similarly, a case of the Rp resistor 11*b* of the Rp resistor 11*b* or the current output circuit is illustrated. Note that the Rp resistors 11*a* and 11*b* may be generically referred to as an Rp resistor 11. The switches 12*a* and 12*b* may be generically referred to as a switch 12. The CC1 terminal 16*a* and the CC2 terminal 16*b* may be generically referred to as a CC terminal 16.

The Rp resistor 11*a* is connected between the CC1 terminal 16*a* and a power supply. A voltage of the power supply is, for example, 5V, but is not limited to this. The Rp resistor 11*a* is connected to the CC1 terminal 16*a* via the switch 12*a*. The switch 12*a* switches a connection destination of the CC1 terminal 16*a* to the Rp resistor 11*a* or a VCONN terminal by controlling the sink and cable connection detector circuit 13. The VCONN terminal supplies power to electronic equipment such as an IC via a cable.

The Rp resistor 11*b* is connected between the CC2 terminal 16*b* and the power supply. The Rp resistor 11*b* is connected to the CC2 terminal 16*b* via the switch 12*b*. The switch 12*b* switches a connection destination of the CC2 terminal 16*b* to the Rp resistor 11*b* or a VCONN terminal under control of the sink and cable connection detector circuit 13.

The sink and cable connection detector circuit 13 detects connection to at least either the sink or the cable. The sink and cable connection detector circuit 13 outputs detected information to a multiplexer control unit (Mux CNTL) and PD. The sink and cable connection detector circuit 13 controls the transistor 14 that connects a power supply VBUS and the VBUS terminal 15. The GND terminal 17 is connected to ground.

Figure 2:
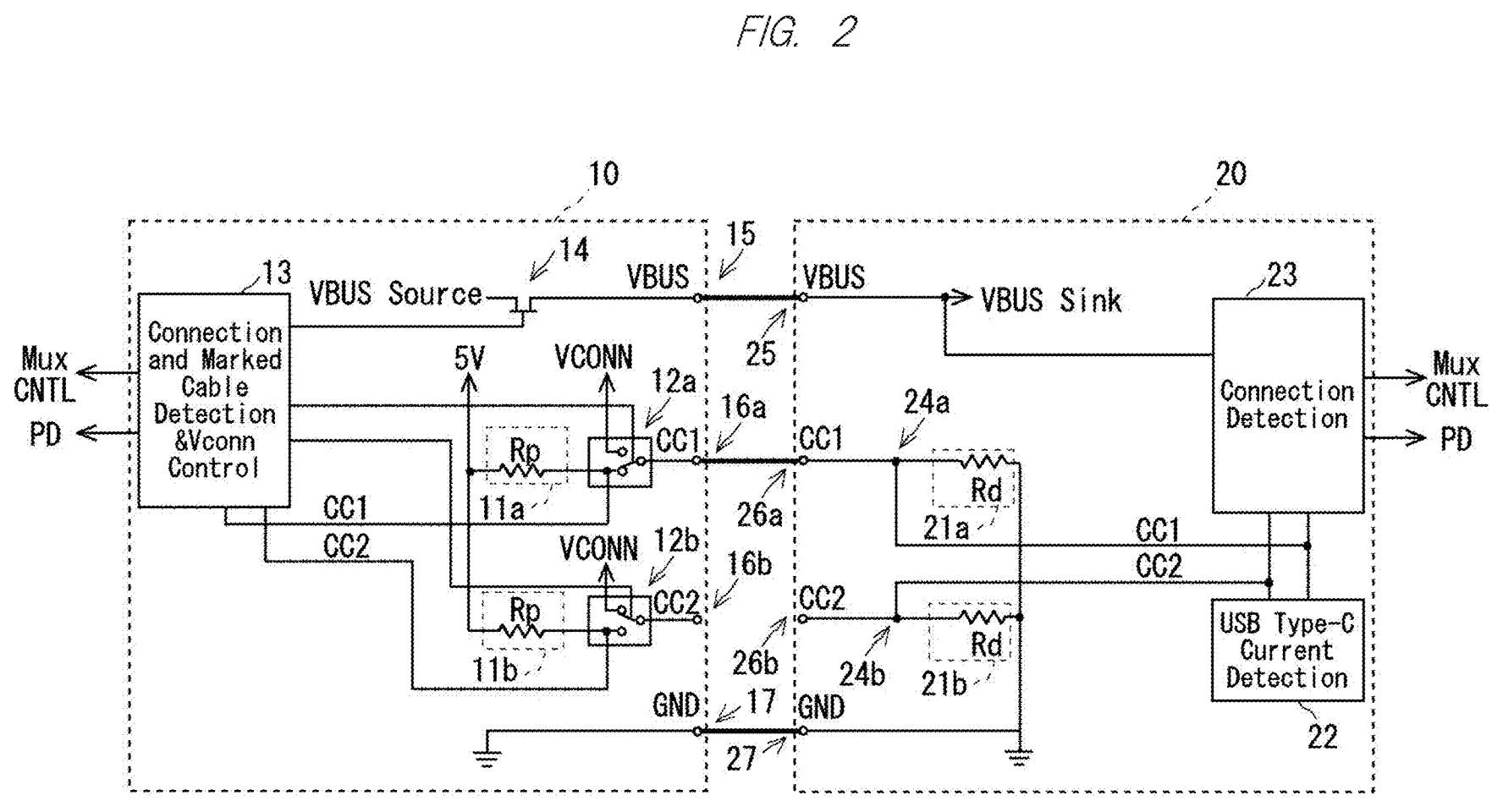

FIG. 2 is a configuration diagram illustrating the connector according to the first comparative example, illustrating a functional model in a case where the sink is connected to the source. FIG. 2 illustrates, for example, a functional model in a case where the sink is connected to the source as described above in the Non-Patent Document 1. As illustrated in FIG. 2, the CCPHY 20 for the sink includes a pulldown (hereinafter referred to as Rd) resistor 21*a*, an Rd resistor 21*b*, a power supply capability detector circuit 22, a source connection detector circuit 23, a VBUS terminal 25, a CC1 terminal 26*a*, a CC2 terminal 26*b*, and a GND terminal 27. Note that the Rd resistors 21*a* and 21*b* may be generically referred to as an Rd resistor 21. The CC1 terminal 26*a* and the CC2 terminal 26*b* may be generically referred to as a CC terminal 26.

When the CCPHY 10 for the source and the CCPHY 20 for the sink are connected to each other, the VBUS terminal 15 is connected to the VBUS terminal 25, the CC1 terminal 16*a* is connected to the CC1 terminal 26*a*, and the GND terminal 17 is connected to the GND terminal 27.

The Rd resistor 21*a* is connected between the CC1 terminal 26*a* and ground. The Rd resistor 21*a* is connected to the CC1 terminal 26*a* via a contact 24*a*. The contact 24*a* is connected to the power supply capability detector circuit 22 and the source connection detector circuit 23.

The Rd resistor 21*b* is connected between the CC2 terminal 26*b* and ground. The Rd resistor 21*b* is connected to the CC2 terminal 26*b* via a contact 24*b*. The contact 24*b* is connected to the power supply capability detector circuit 22 and the source connection detector circuit 23.

The power supply capability detector circuit 22 is connected to the contact 24*a*, the contact 24*b*, and the source connection detector circuit 23. The power supply capability detector circuit 22 detects a power supply capability of the connected CCPHY 10 by detecting a voltage level of at least any one of the Rd resistor 21*a*, the Rd resistor 21*b*, and the current output circuit. The power supply capability detector circuit 22 may output a detection result to the source connection detector circuit 23.

The source connection detector circuit 23 is connected to the contact 24*a*, the contact 24*b*, the power supply capability detector circuit 22, and the VBUS terminal 25. The source connection detector circuit 23 may detect connection to the CCPHY 10 for the source by detecting a voltage level of at least any one of the Rd resistor 21*a*, the Rd resistor 21*b*, and the current output circuit. The source connection detector circuit 23 may detect connection to the CCPHY 10 for the source on the basis of the detection result of the power supply capability detector circuit 22. The source connection detector circuit 23 may detect the power supply of the VBUS terminal 25.

The source connection detector circuit 23 outputs detected information to the multiplexer control unit (Mux CNTL) and the PD. The GND terminal 27 is connected to ground.

Thus, in the connector according to the comparative example, when the CCPHY 10 and the CCPHY 20 are connected to each other, the CCPHY 10 and the CCPHY 20 mutually detect respective voltage levels of, for example, the Rp resistors 11*a* and 11*b*, the Rd resistors 21*a* and 21*b*, and the current output circuits to determine the connection and the state of the front side/rear side of the plug.

Problems Found by Inventors

Figure 3:
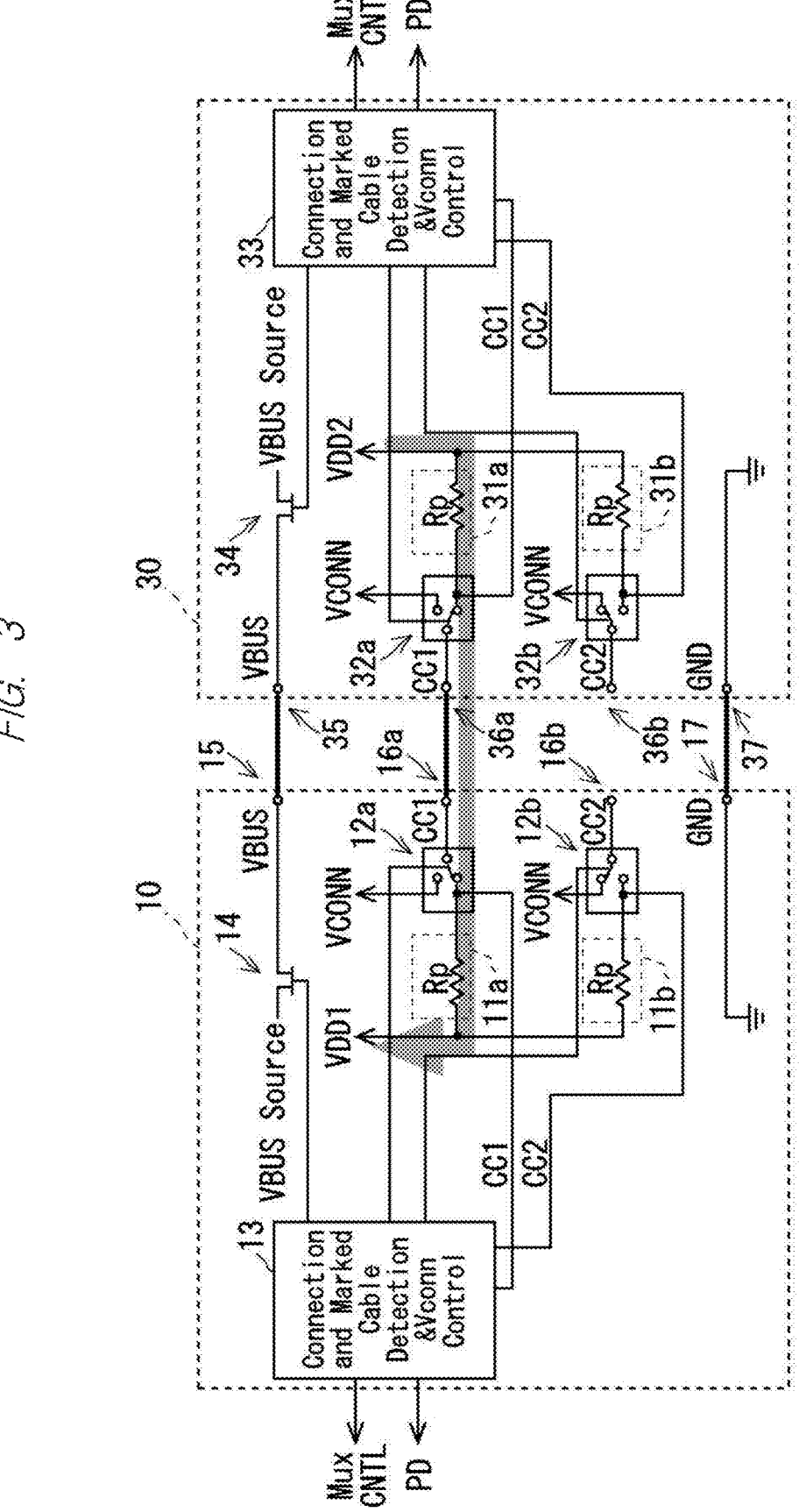
FIG. 3 is a configuration diagram illustrating the connector according to the first comparative example, illustrating a functional model in a case where sources are connected to each other.

Next, problems found by the inventors will be described. FIG. 3 is a configuration diagram illustrating the connector according to the first comparative example, illustrating a functional model in a case where sources are connected to each other. As illustrated in FIG. 3, a CCPHY 30 is the CCPHY for the source as similar to the CCPHY 10. The CCPHY 30 for the source includes an Rp resistor 31*a* or a current output circuit, an Rp resistor 31*b* or a current output circuit, a switch 32*a*, a switch 32*b*, a sink and cable connection detector circuit 33, a transistor 34, a VBUS terminal 35, a CC1 terminal 36*a*, a CC2 terminal 36*b*, and a GND terminal 37.

The Rp resistor 31*a*, the Rp resistor 31*b*, the switch 32*a*, the switch 32*b*, the sink and cable connection detector circuit 33, the transistor 34, the VBUS terminal 35, the CC1 terminal 36*a*, the CC2 terminal 36*b*, and the GND terminal 37 respectively have similar functions to those of the Rp resistor 11*a*, the Rp resistor 11*b*, the switch 12*a*, the switch 12*b*, the sink and cable connection detector circuit 13, the transistor 14, the VBUS terminal 15, the CC1 terminal 16*a*, the CC2 terminal 16*b*, and the GND terminal 17.

In the existing USB equipment before the Type-C connector 1, respective functions of the source and the sink can be distinguished depending on a type of the connector to be mounted. Therefore, the sources are not connected to each other. However, in the Type-C connector 1, respective functions of the source and the sink cannot be distinguished depending on the type of the connector. Therefore, the sources may be connected to each other. When the sources are connected to each other, the sinks cannot be mutually detected. Therefore, the power is not mutually supplied from the VBUS power supply. The sources remain connected as long as the connection between the sources is not canceled. Therefore, the Rp resistor 11, the Rp resistor 31 or the current output circuit remains waited while being mutually turned on.

In the Type-C connector 1, a power supply voltage of the current output circuit is allowed to be designed to 5V or 3.3V as a standard. Accordingly, respective power supply voltages connected to the Rp resistor 11, the Rp resistor 31 or the current output circuit of the connected sources may differ from each other.

As illustrated in FIG. 3, a power supply voltage VDD1 of the CCPHY 10 for the source is assumed to be 3.3V, and a power supply voltage VDD2 of the CCPHY 30 for the source is assumed to be 5V. In this case, a current flows from the power source voltage VDD2 into the power supply voltage VDD1 during a period from the connection between the sources to the pulling out of the plug. As a result, respective voltages of the CC1 terminals 16a and 36a rise. Accordingly, there is a concern about the characteristic deterioration of an element such as the current output circuit connected to the power supply voltage VDD1. Alternatively, if the CCPHY 10 is designed using a transistor having a low absolute maximum rating, there is a concern about destruction of the element itself. In order to avoid such concerns, the CCPHY 10 is generally designed using a transistor having a high withstand voltage that is equal to or higher than 5V in a circuit of the Type-C connector 1 according to the comparative example.

However, if the CCPHY 10 is designed using the transistor having the high withstand voltage, the following problems occur.

Problem 1. Manufacture of the transistor having the high withstand voltage leads to an increase in the number of masks used for lithography, and therefore, a manufacturing cost increases.

Problem 2. If the Type-C connector 1 is mounted in combination with a USB 3.x/USB 2.0 designed in an advanced process, only the CCPHY 10 is often a different chip, and therefore, BOM (bill of materials) cost increases.

First Embodiment

Next, an overvoltage protection circuit according to a first embodiment will be described. The overvoltage protection circuit according to the present embodiment is for, for example, solving the above-described problems.

<Configuration of Overvoltage Protection Circuit>

Figure 4:
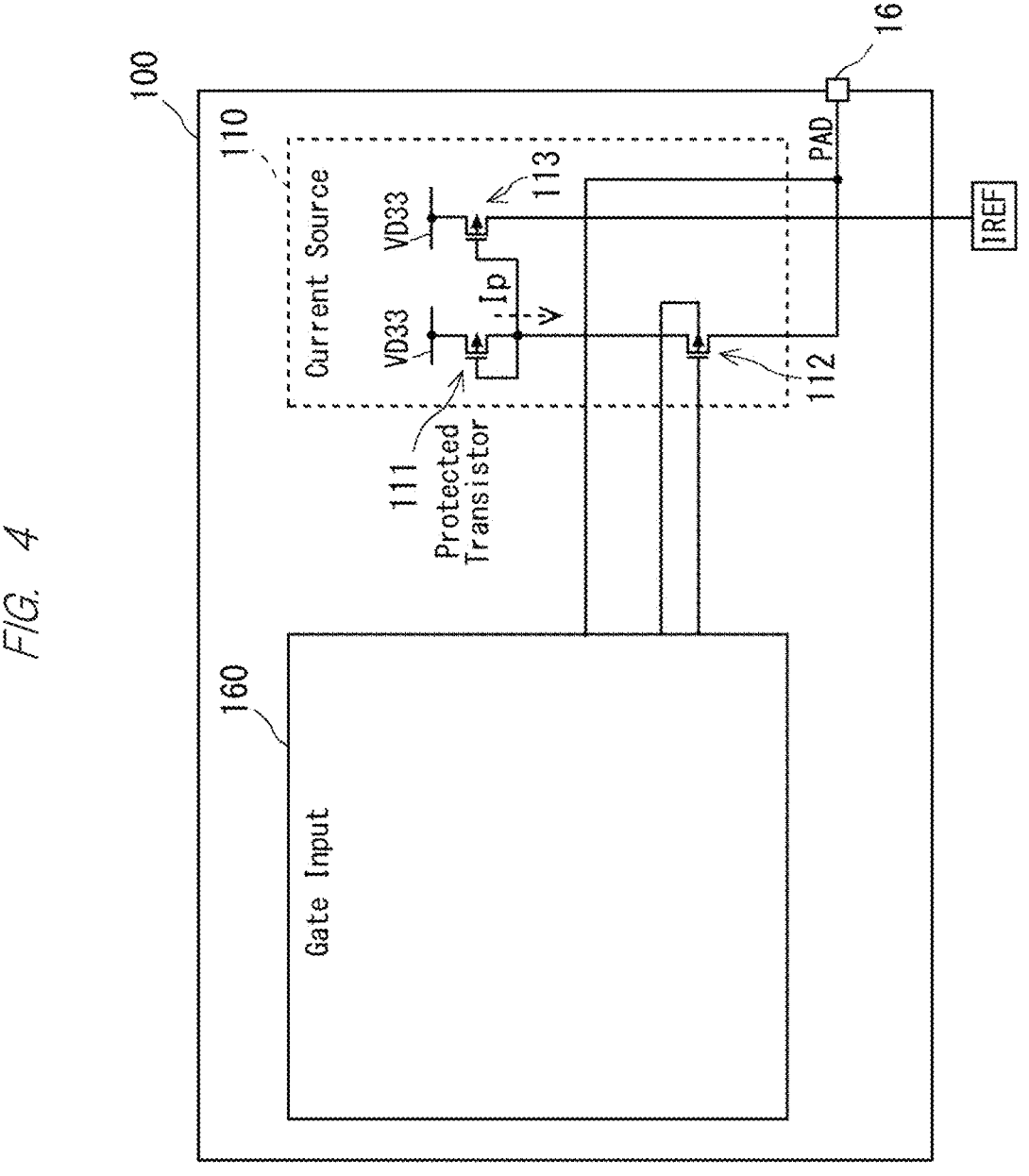
FIG. 4 is a configuration diagram illustrating an overvoltage protection circuit according to a first embodiment.
Figure 5:
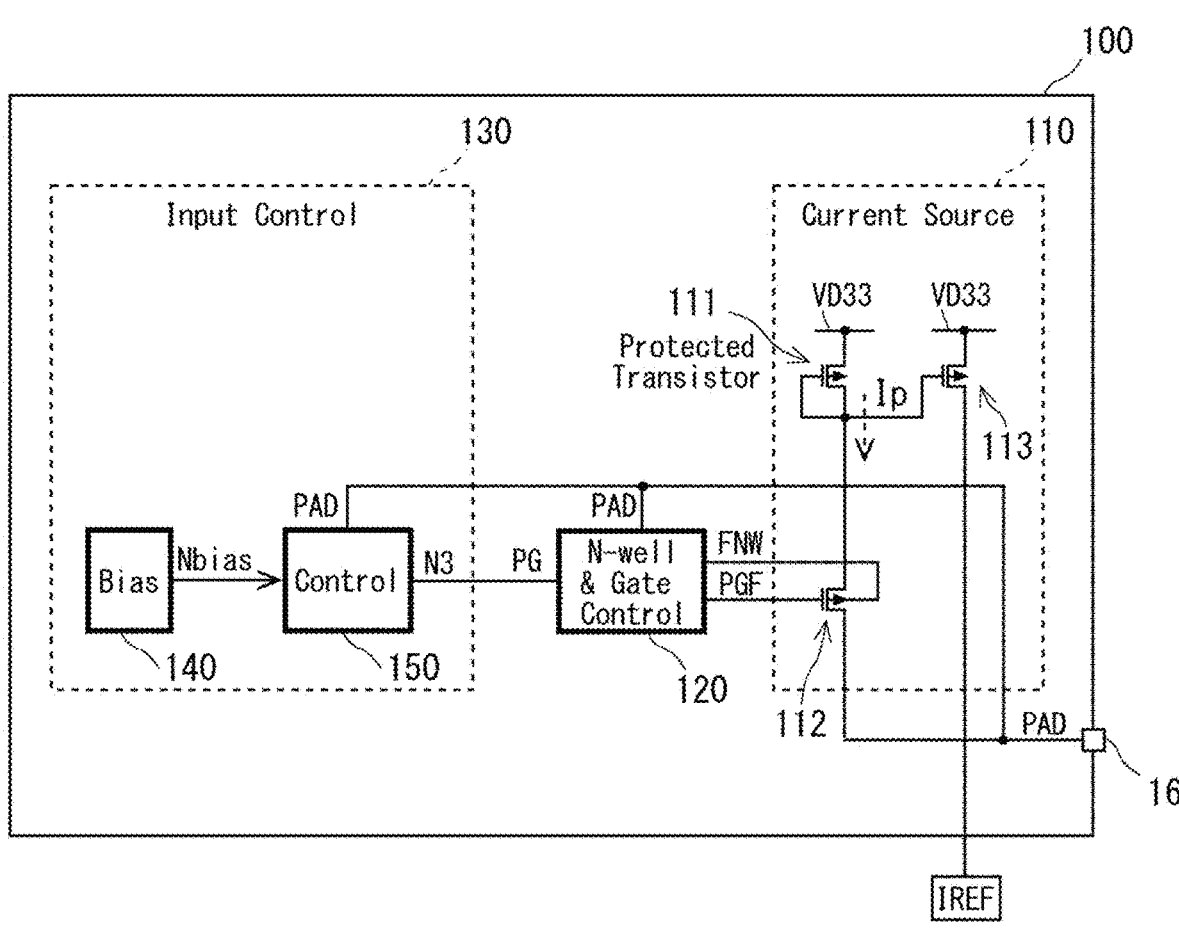
FIG. 5 is a configuration diagram illustrating the overvoltage protection circuit according to the first embodiment.

Each of FIGS. 4 and 5 is a configuration diagram illustrating the overvoltage protection circuit according to the first embodiment. Each of FIGS. 4 and 5 partially illustrates the overvoltage protection circuit in a block diagram and partially illustrates it as a circuit diagram. As illustrated in FIG. 4, an overvoltage protection circuit 100 includes a current output circuit 110 and a gate input circuit 160. Specifically, as illustrated in FIG. 5, the overvoltage protection circuit 100 may include the current output circuit 110, a gate control circuit 120, an input control circuit 130, a terminal wiring PAD, an input wiring PG, a gate wiring PGF, and a back gate wiring FNW. That is, the gate input circuit 160 may include the gate control circuit 120 and the input control circuit 130.

The current output circuit 110 includes a transistor 111, a transistor 112, and a transistor 113. The transistor 111, the transistor 112, and the transistor 113 may be respectively referred to as a first transistor, a second transistor, and a third transistor. Each of the transistor 111, the transistor 112, and the transistor 113 is, for example, a P-type MOS (metal oxide semiconductor) transistor. Note that each of the transistor 111, the transistor 112, and the transistor 113 is not limited to one of a P type but may be one of an N type, or is not limited to a MOS transistor but may be a transistor of another type. The same applies to each of the following transistors.

The transistor 111 is arranged between a power supply VD33 and a terminal. The terminal is, for example, the CC terminal 16 for the source of the Type-C connector 1 in the USB. The terminal will be described as the CC terminal 16 below. The transistor 111 is driven such that a current Ip flows from the power supply VD33. The transistor 112 is arranged between the transistor 111 and the CC terminal 16. The transistor 112 is driven to protect the transistor 111 from a voltage applied to the CC terminal 16. The transistor 113 is arranged between the power supply VD33 and a wiring through which a reference current IREF flows. The gate of the transistor 111 is connected to the gate of the transistor 113.

The current output circuit 110 outputs this current Ip to the transistor 111 to be driven such that the current Ip flows from the power supply VD33. The current output circuit 110 protects the transistor 111 from the voltage applied to the CC terminal 16 under control of the transistor 112. A voltage of the power supply VD33 may be, for example, a voltage lower than 5V. For example, the voltage of the power supply VD33 is 3.3V. Note that the voltage of the power supply VD33 is not limited to the voltage lower than 5V and 3.3V. The transistor 111 may not be a transistor withstanding a high voltage higher than 3.3V. Therefore, the CCPHY 10 may be designed without using the transistor withstanding the high voltage higher than 3.3V. That is, the transistor 111 and the CCPHY 10 may be respectively a transistor and a CCPHY each withstanding a voltage equal to or lower than 3.3V.

As illustrated in FIG. 4, the gate input circuit 160 controls a voltage of a gate and a voltage of a back gate of the transistor 112. The gate input circuit 160 controls the voltage of the gate of the transistor 112 and the voltage of the back gate in response to the voltage applied to the CC terminal 16. A specific example of the gate input circuit 160 will be described below.

As illustrated in FIG. 5, the gate control circuit 120 may be referred to as an N-well and gate control circuit 120. The gate control circuit 120 is connected to the gate of the transistor 112 by the gate wiring PGF. The gate wiring PGF is a wiring connected to the gate of the transistor 112. The gate control circuit 120 is connected to the back gate of the transistor 112 by the back gate wiring FNW. The back gate wiring FNW is a wiring connected to the back gate of the transistor 112. The gate control circuit 120 controls the gate and the back gate of the transistor 112, respectively, via the gate wiring PGF and the back gate wiring FNW. Specifically, the gate control circuit 120 may control, for example, the voltage of the gate and the voltage of the back gate of the transistor 112.

The gate control circuit 120 is connected to a contact N3 of the input control circuit 130 by the input wiring PG. The input wiring PG is a wiring to which an input voltage is input from the input control circuit 130. To the gate control circuit 120, the input voltage is input from the input control circuit 130. The gate control circuit 120 controls the gate and the back gate of the transistor 112 in response to the received input voltage.

The gate control circuit 120 is connected to the CC terminal 16 via the terminal wiring PAD. The terminal wiring PAD is a wiring connected to the CC terminal 16. When an overvoltage is applied to the CC terminal 16 at the time of an operation of the current output circuit 110, the gate control circuit 120 controls the gate and the back gate of the transistor 112 for overvoltage protection in the current output circuit 110 so as to follow the voltage applied to the CC terminal 16. As a result, the gate control circuit 120 controls a voltage of the N well and a gate voltage of the transistor 112.

For example, when receiving a first input voltage as input from the input control circuit 130, the gate control circuit 120 controls the gate of the transistor 112 via the gate wiring PGF and the back gate wiring FNW such that the current output circuit 110 outputs the current Ip to the CC terminal 16. Specifically, when receiving 0V as the first input voltage, the gate control circuit 120 sets the gate voltage and the back gate voltage of the transistor 112, respectively, to 0V and 3.3V, and turns on the transistor 112.

On the other hand, when receiving a second input voltage as input from the input control circuit 130, the gate control circuit 120 controls the gate of the transistor 112 to protect the current output circuit 110. Specifically, when receiving 3.3V as the second input voltage, the gate control circuit 120 turns off the transistor 112.

The input control circuit 130 is connected to the gate control circuit 120 via the input wiring PG. The input control circuit 130 inputs the input voltage to the gate control circuit 120 via the input wiring PG. The input control circuit 130 is connected to the CC terminal 16 via the terminal wiring PAD. The input control circuit 130 changes the input voltage in response to the voltage applied to the CC terminal 16.

For example, when a first voltage equal to or lower than a predetermined threshold value is applied to the CC terminal 16, the input control circuit 130 inputs the first input voltage as the input voltage to the gate control circuit 120. On the other hand, when a second voltage higher than the predetermined threshold value is applied to the CC terminal 16, the input control circuit 130 inputs the second input voltage as the input voltage to the gate control circuit 120. The input control circuit 130 inputs at least either one of the first input voltage and the second input voltage to the gate control circuit 120 via the input wiring PG. The predetermined threshold value is, for example, the same voltage value as that of the voltage of the power supply VD33.

Thus, the input control circuit 130 switches setting of the input voltage to be input to the gate control circuit 120 in accordance with a voltage range applied to the CC terminal 16. By such a configuration, the overvoltage protection circuit 100 achieves both a normal operation within an operation-guaranteed range of the current output circuit 110 and protection of the current output circuit 110 from the overvoltage.

The input control circuit 130 includes a bias circuit 140 and a control circuit 150. The bias circuit 140 generates a reference current Nbias. The bias circuit 140 is connected to the control circuit 150. The bias circuit 140 supplies the generated reference current Nbias to the control circuit 150 for the purpose of protecting the input control circuit 130 itself from the overvoltage. The control circuit 150 is connected to the CC terminal 16 via the terminal wiring PAD. The control circuit 150 is connected to the gate control circuit 120 via the input wiring PG. The control circuit 150 controls the input voltage to be input to the gate control circuit 120 in accordance with the voltage range to be applied to the CC terminal 16.

Figure 6:
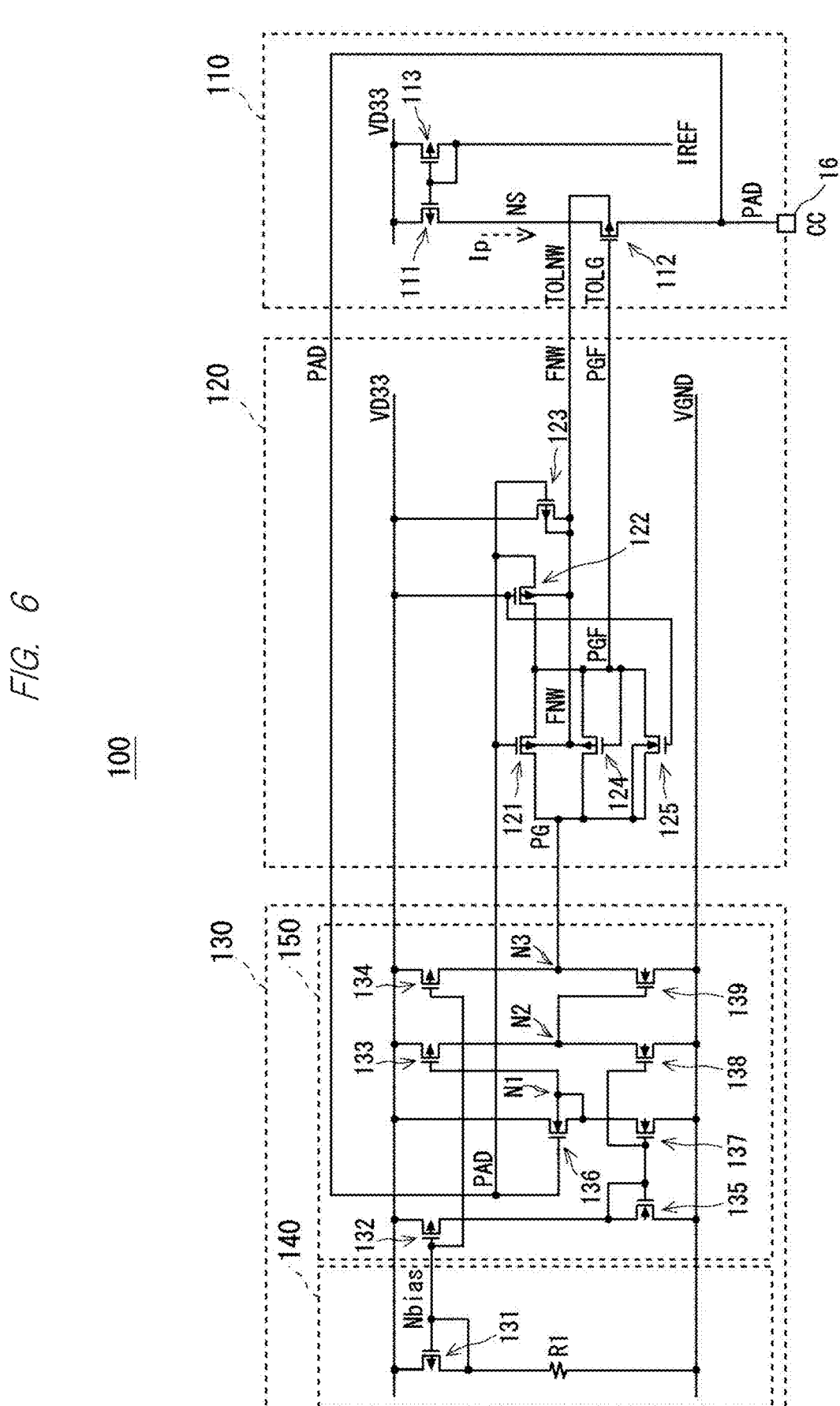
FIG. 6 is a circuit diagram illustrating the overvoltage protection circuit according to the first embodiment.

FIG. 6 is a circuit diagram illustrating the overvoltage protection circuit 100 according to the first embodiment. As illustrated in FIG. 6, in the current output circuit 110, one end of the transistor 111 is connected to the power supply VD33, and the other end of the transistor 111 is connected to one end of the transistor 112. The gate of the transistor 111 is connected to the gate of the transistor 113.

One end of the transistor 112 is connected to the other end of the transistor 111, and the other end of the transistor 112 is connected to the CC terminal 16. The gate and the back gate of the transistor 112 are connected to the gate control circuit 120. Specifically, the gate of the transistor 112 is connected to the gate control circuit 120 via the gate wiring PGF, and the back gate of the transistor 112 is connected to the gate control circuit 120 via the back gate wiring FNW.

One end of the transistor 113 is connected to the power supply VD33, and the other end of the transistor 113 is connected to the wiring through which the reference current IREF flows. The gate of the transistor 113 is connected to the gate of the transistor 111.

When the transistor 111, the transistor 112, and the transistor 113 are each a PMOS transistor, the one end of each of the transistor 111, the transistor 112, and the transistor 113 may be the source and the other end thereof may be the drain.

The gate control circuit 120 includes a transistor 121, a transistor 122, a transistor 123, a transistor 124, and a transistor 125. The transistors 121 to 125 may be respectively referred to as gate control transistors 121 to 125 so as to represent transistors arranged in the gate control circuit 120. The transistor 121, the transistor 122, the transistor 123, and the transistor 124 are, for example, each a PMOS transistor. The transistor 125 is, for example, an NMOS transistor.

One end of the transistor 121 is connected to the input wiring PG, and the other end of the transistor 121 is connected to the gate wiring PGF. The gate of the transistor 121 is connected to the terminal wiring PAD, and the back gate of the transistor 121 connected to the back gate wiring FNW.

One end of the transistor 122 is connected to the gate wiring PGF, and the other end of the transistor 122 is connected to the terminal wiring PAD. The gate of the transistor 122 is connected to the power supply VD33, and the back gate of the transistor 122 is connected to the back gate wiring FNW.

One end of the transistor 123 is connected to the power supply VD33, and the other end the transistor 123 is connected to the back gate wiring FNW. The gate of the transistor 123 is connected to the terminal wiring PAD, and the back gate of the transistor 123 is connected to the back gate wiring FNW.

One end of transistor 124 is connected to the input wiring PG, and the other end of transistor 124 is connected to the gate wiring PGF. The gate of the transistor 124 is connected to the gate wiring PGF. The back gate of the transistor 124 is connected to the back gate wiring FNW.

One end of transistor 125 is connected to the gate wiring PGF, and the other end of transistor 125 is connected to the input wiring PG. The gate of the transistor 125 is connected to the power supply VD33, and the back gate of the transistor 125 is connected to the input wiring PG.

If the transistor 121, the transistor 122, the transistor 123, and the transistor 124 are each a PMOS transistor while the transistor 125 is an NMOS transistor, for example, the one end of each of the transistors 121 to 125 may be the source while the other end thereof may be the drain.

The input control circuit 130 includes a transistor 131, a transistor 132, a transistor 133, a transistor 134, a transistor 135, a transistor 136, a transistor 137, a transistor 138, a transistor 139, a resistor R1, a contact N1, a contact N2, and a contact N3. The transistors 131 to 139 may be respectively referred to as input control transistors 131 to 139 so as to represent transistors arranged in the input control circuit 130. The contact N1, the contact N2 and the contact N3 may be respectively referred to as a first contact, a second contact and a third contact.

The transistor 131, the transistor 132, the transistor 133, and the transistor 134 are, for example, each a PMOS transistor. The transistor 135, the transistor 136, the transistor 137, the transistor 138, and the transistor 139 are, for example, each an NMOS transistor.

One end of the transistor 131 is connected to the power supply VD33. The other end of the transistor 131 is connected to one end of the resistor R1, the gate of the transistor 131, the gate of the transistor 132, and the gate of the transistor 134. The gate of the transistor 131 is connected to the other end of the transistor 131, the gate of the transistor 132, the gate of the transistor 134, and the one end of the resistor R1.

The one end of the resistor R1 is connected to the other end of the transistor 131, the gate of the transistor 131, the gate of the transistor 132, and the gate of the transistor 134. The other end of the resistor R1 is connected to ground.

One end of the transistor 132 is connected to the power supply VD33, and the other end of the transistor 132 is connected to the other end of the transistor 135, the gate of the transistor 135, the gate of the transistor 137, and the gate of the transistor 138. The gate of the transistor 132 is connected to the gate of the transistor 131, the other end of the transistor 131, the one end of the resistor R1, and the gate of the transistor 134.

One end of the transistor 133 is connected to the power supply VD33, and the other end of the transistor 133 is connected to the contact N2. The gate of the transistor 133 is connected to the contact N1.

One end of the transistor 134 is connected to the power supply VD33, and the other end of the transistor 134 is connected to the contact N3. The gate of the transistor 134 is connected to the gate of the transistor 131, the other end of the transistor 131, the one end of the resistor R1, and the gate of the transistor 132.

One end of the transistor 135 is connected to ground, and the one end of the transistor 135 is connected to the other end of the transistor 132, the gate of the transistor 135, the gate of the transistor 137, and the gate of the transistor 138. The gate of the transistor 135 is connected to the other end of the transistor 132, the one end of the transistor 135, the gate of the transistor 137, and the gate of the transistor 138.

One end of the transistor 136 is connected to the other end of the transistor 137 and the contact N1, and the other end of the transistor 136 is connected to the power supply VD33. The gate of the transistor 136 is connected to the terminal wiring PAD, and the back gate of the transistor 136 is connected to the contact N1.

One end of the transistor 137 is connected to ground, and the one end of the transistor 137 is connected to the one end of the transistor 136 and the contact N1. The gate of the transistor 137 is connected to the other end of the transistor 132, the other end of the transistor 135, the gate of the transistor 135, and the gate of the transistor 138.

One end of the transistor 138 is connected to ground, and the other end of the transistor 138 is connected to the contact N2. The gate of the transistor 138 is connected to the gate of the transistor 135, the other end of the transistor 135, the other end of the transistor 132, and the gate of the transistor 137.

One end of the transistor 139 is connected to ground, and the other end of the transistor 139 is connected to the contact N3. The gate of the transistor 139 is connected to the contact N2.

The contact N1 is connected to the back gate of the transistor 136, the one end of the transistor 136, the other end of the transistor 137, and the gate of the transistor 133. The contact N2 is connected to the other end of the transistor 133, the other end of the transistor 138, and the gate of the transistor 139. The contact N3 is connected to the other end of the transistor 134, the other end of the transistor 139, and the input wiring PG.

If the transistors 131 to 134 are each a PMOS transistor while the transistors 135 to 139 are each an NMOS transistor, for example, the one end of each of the transistors 131 to 139 may be the source while the other end thereof may be the drain.

<Operation of Overvoltage Protection Circuit>

Figure 7:
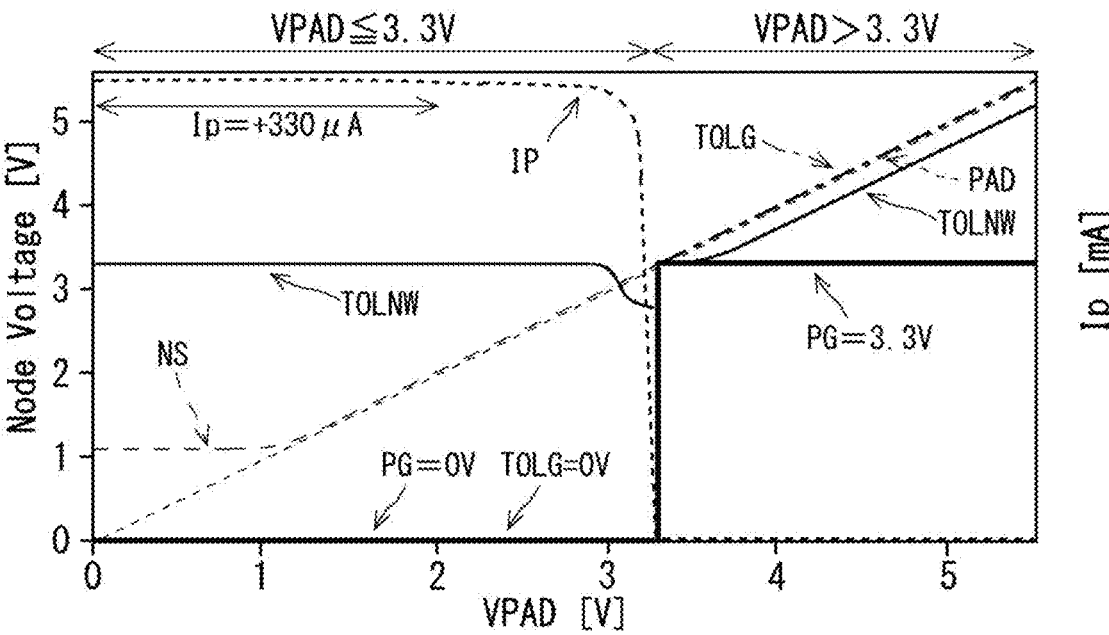
FIG. 7 is a graph illustrating an operation of the overvoltage protection circuit according to the first embodiment, where a horizontal axis represents a voltage applied to a CC terminal, a vertical axis on the left side represents a voltage, and a vertical axis on the right side represents a current.

Next, an operation of the overvoltage protection circuit 100 according to the present embodiment will be described. FIG. 7 is a graph illustrating the operation of the overvoltage protection circuit 100 according to the first embodiment, where a horizontal axis represents a voltage VPAD applied to the CC terminal 16, a vertical axis on the left side represents a voltage, and a vertical axis on the right side represents a current.

As illustrated in FIG. 7, when the voltage VPAD applied to the CC terminal 16 is equal to or lower than, for example, 3.3V, the input control circuit 130 sets the input voltage to be input to the gate control circuit 120 via the input wiring PG to 0V (PG=0V). As a result, the gate control circuit 120 fixes a gate voltage of the transistor 112 for overvoltage protection in the current output circuit 110 to 0V via the gate wiring PGF (TOLG). Also, the gate control circuit 120 fixes a back gate voltage of the transistor 112 to 3.3V via the back gate wiring FNW (TOLNW). Because of such an operation, the current output circuit 110 can output the predetermined current Ip via the other end of the transistor 111 (NS≤3.3 V) within an operation-guaranteed range specified in a standard.

On the other hand, when the voltage applied to the CC terminal 16 is higher than 3.3V, the input control circuit 130 sets the input voltage to be input to the gate control circuit 120 via the input wiring PG to 3.3V (PG=3.3V). As a result, the gate control circuit 120 controls voltages of the gate and the back gate of the transistor 112 in the current output circuit 110, respectively, via the gate wiring PGF (TOLG) and the back gate wiring (TOLNW) while following the voltage VPAD applied to the CC terminal 16 (i.e., a voltage of the terminal wiring PAD). Therefore, the overvoltage protection circuit 100 can protect the current output circuit 110 from an overvoltage.

Next, an effect of the present embodiment will be described. The overvoltage protection circuit 100 according to the present embodiment can suppress the characteristic deterioration and destruction of the internal element even if a high voltage is applied to a terminal such as the CC terminal 16 during the operation of the current output circuit 110 without using the transistor having the high withstand voltage. Accordingly, the semiconductor device including the connector or the like can be protected from the overvoltage while suppressing the manufacturing cost.

The overvoltage protection circuit 100 according to the present embodiment switches the setting of the input voltage of the gate control circuit 120 in accordance with a range of the voltage applied to the terminal such as the CC terminal

13

16. This makes it possible to achieve both the normal operation of the current output circuit 110 and the overvoltage protection.

Second Comparative Example

Next, a second comparative example and a second embodiment will be described. A connector according to the second comparative example is compatible with the DRP (dual role power). The Type-C connector has a concept of the DRP. In the DRP, at the time of disconnection of the Type-C connector, respective functions of the source and the sink are allowed to be periodically switched.

Figure 8:
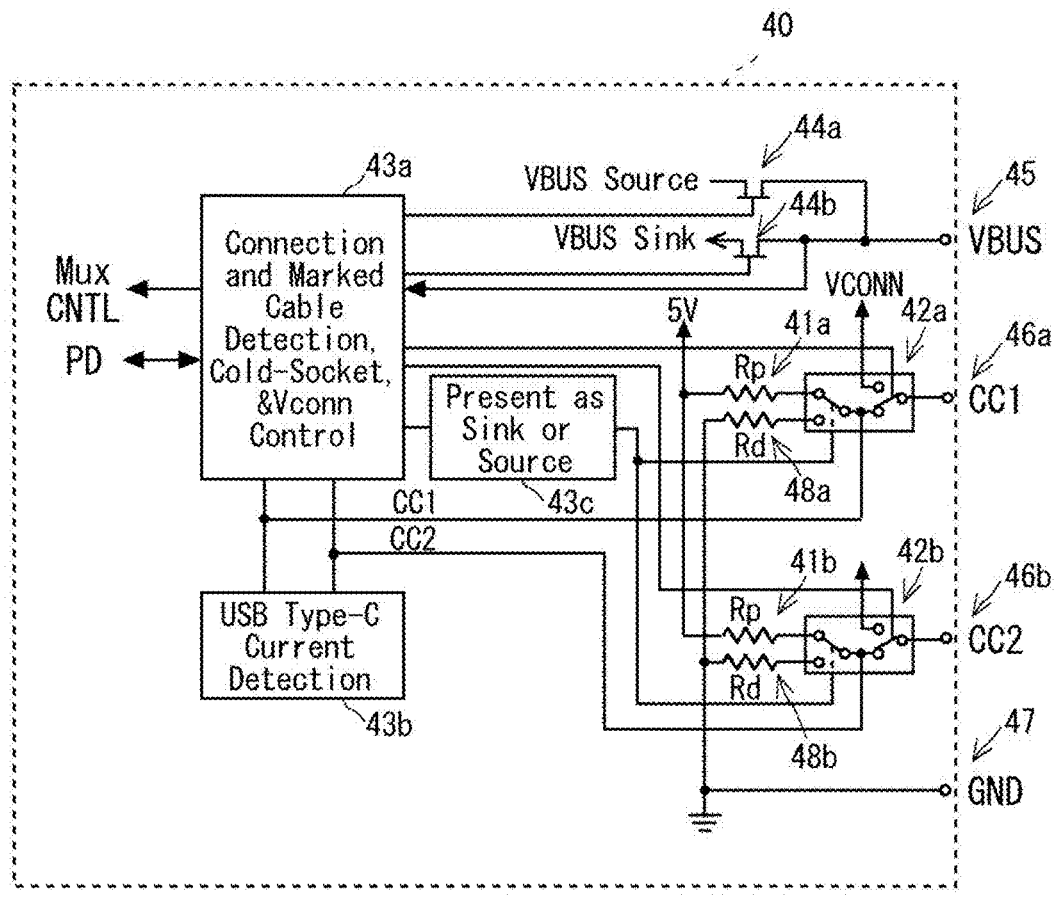
FIG. 8 is a configuration diagram illustrating a connector according to a second comparative example, illustrating a functional model compatible with DRP.

FIG. 8 is a configuration diagram illustrating the connector according to the second comparative example, illustrating a functional model compatible with the DRP. FIG. 8 illustrates, for example, the DRP functional model of the Non-Patent Document as described above. As illustrated in FIG. 8, a CCPHY 40 according to the second comparative example includes an Rp resistor 41*a* or a current output circuit, an Rp resistor 41*b* or a current output circuit, an Rd resistor 48*a*, an Rd resistor 48*b*, a switch 42*a*, a switch 42*b*, a source/sink and cable connection detector circuit 43*a*, a power supply capability detector circuit 43*b*, a sink/source detector circuit 43*c*, a transistor 44*a*, a transistor 44*b*, a VBUS terminal 45, a CC1 terminal 46*a*, a CC2 terminal 46*b*, and a GND terminal 47. Here, a case of the Rp resistor 41*a* as the Rp resistor 41*a* or the current output circuit is described, and a case of the Rp resistor 41*b* as the Rp resistor 41*b* or the current output circuit is described. As illustrated in FIG. 8, the CCPHY 40 has respective functions of both the source and the sink. In the CCPHY 40, either one of the functions of the source and the sink can also operate in accordance with a role of an opposite device. For example, when receiving a signal compatible with the DRP for switching into the source or the sink, the CCPHY 40 switches the role of the source or the sink.

Problems Found by Inventors

Figure 9:
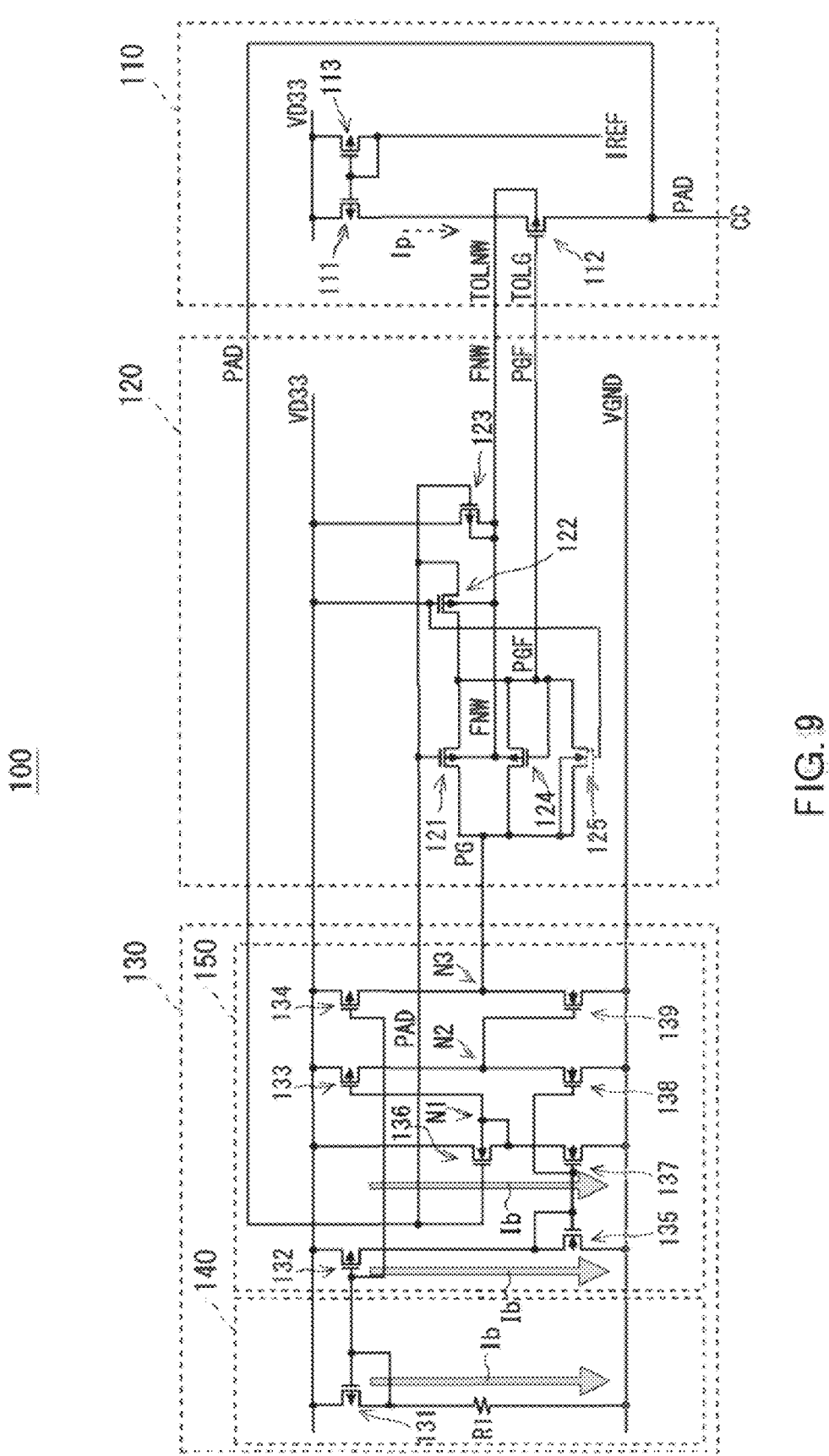
FIG. 9 is a diagram illustrating problems of an overvoltage protection circuit applied to the connector according to the second comparative example.

FIG. 9 is a diagram illustrating problems of an overvoltage protection circuit applied to the connector according to the second comparative example. A case of the application of the overvoltage protection circuit 100 according to the first embodiment to the CCPHY 40 according to the second comparative example is considered. In the case of the application of the overvoltage protection circuit 100 according to the first embodiment to the CCPHY 40 compatible with the DRP, if the CCPHY 40 is connected as the sink to the source, the current output circuit 110 of the overvoltage protection circuit 100 of the CCPHY 40 is unused. Nevertheless, a bias circuit 140 of an input control circuit 130 remains always ON. Accordingly, there is a problem that an unnecessary current Ib of about several tens of A continues to constantly flow as illustrated in FIG. 9.

Second Embodiment

Next, an overvoltage protection circuit according to a second embodiment will be described. In order to solve the above-described problem, the overvoltage protection circuit according to the present embodiment is made to be compatible with the DRP by adding a disabling function to the input control circuit 130. Specifically, in the overvoltage protection circuit, the disabling function is invalidated or validated in synchronization with the signal compatible with the DRP for switching into the source or the sink. As a result, in the case of the operation as the sink, the disabling function is validated to stop the constant current. On the other hand, in the case of the operation as the source, the disabling function is invalidated. Therefore, the overvoltage protection circuit 100 can be operated as similar to the overvoltage protection circuit 100 according to the first embodiment.

<Configuration of Overvoltage Protection Circuit>

Figure 10:
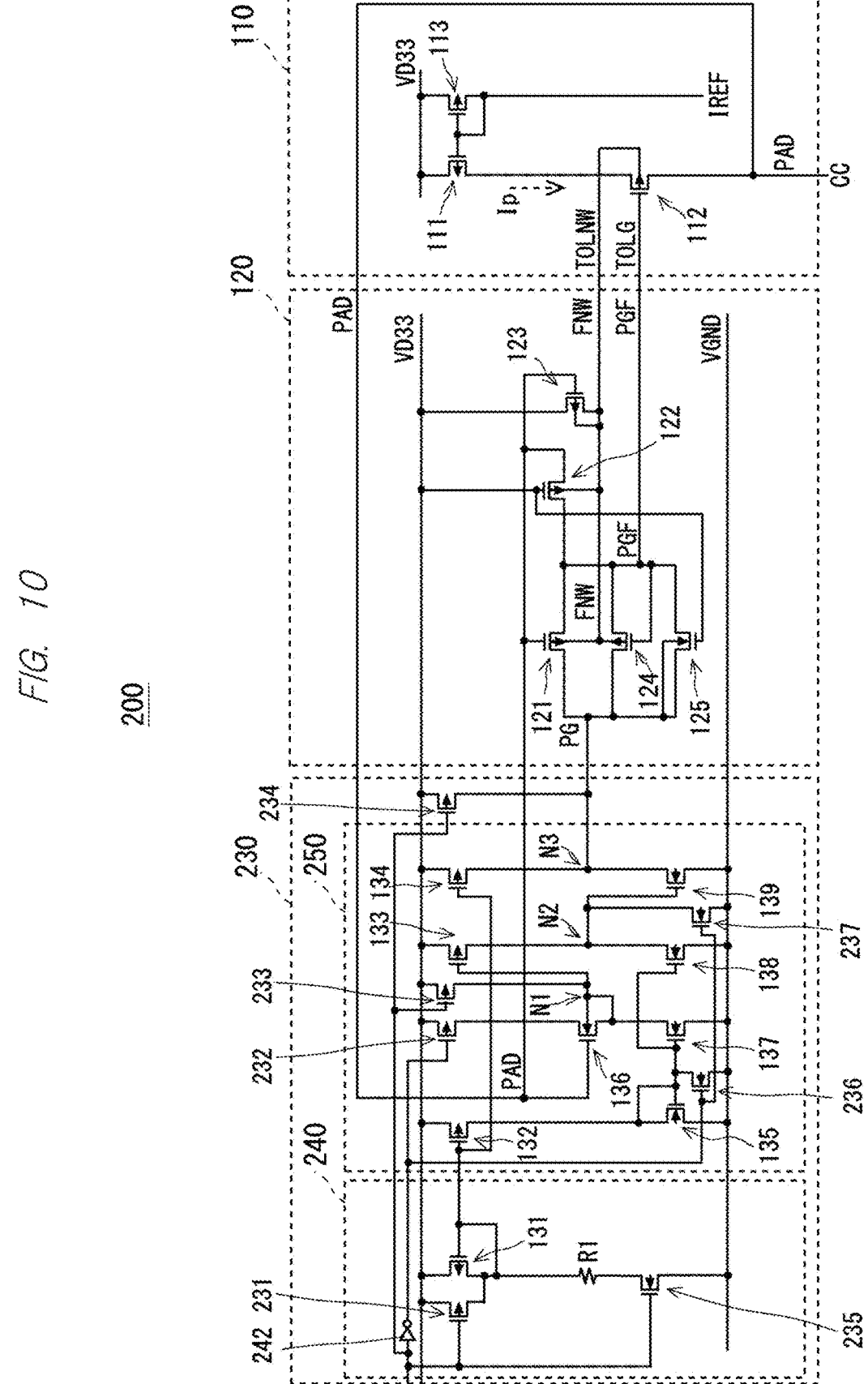
FIG. 10 is a circuit diagram illustrating an overvoltage protection circuit according to a second embodiment.

FIG. 10 is a circuit diagram illustrating the overvoltage protection circuit according to the second embodiment. As illustrated in FIG. 10, an overvoltage protection circuit 200 according to the present embodiment includes a current output circuit 110, a gate control circuit 120, and an input control circuit 230. Respective configurations of the current output circuit 110 and the gate control circuit 120 in the overvoltage protection circuit 200 are similar to the configuration of the overvoltage protection circuit 100 according to the first embodiment.

The input control circuit 230 includes a disable means having a function of disabling the input control circuit 130 in addition to the configuration of the input control circuit 130. Specifically, the input control circuit 230 includes a bias circuit 240, a control circuit 250, and a disable means having a function of disabling these circuits.

The disable means disables the bias circuit 240 and the control circuit 250 such that, for example, the input control circuit 230 inputs the same voltage value as that of the power supply VD33 as the input voltage to be input to the gate control circuit 120 via the input wiring PG. The disable means includes a signal terminal 241 to which an enable signal is input, an inverter 242, a transistor 231, a transistor 232, a transistor 233, a transistor 234, a transistor 235, a transistor 236, and a transistor 237.

The transistors 231 to 237 may be respectively referred to as disable transistors 231 to 237 so as to represent transistors included in the disable means. The transistor 231, the transistor 232, the transistor 233, and the transistor 234 are, for example, each a PMOS transistor. The transistor 235, the transistor 236, and the transistor 237 are, for example, each an NMOS transistor.

An input terminal of the inverter 242 is connected to the signal terminal 241, the gate of the transistor 231, the gate of the transistor 233, the gate of the transistor 234, and the gate of the transistor 235. An output terminal of the inverter 242 is connected to the gate of the transistor 232, the gate of the transistor 236, and the gate of the transistor 237.

One end of the transistor 231 is connected to the power supply VD33, and the other end of the transistor 231 is connected to one end of the resistor R1, the other end of the transistor 131, the gate of the transistor 131, the gate of a transistor 132, and the gate of the transistor 134. The gate of the transistor 231 is connected to the signal terminal 241, the input terminal of the inverter 242, the gate of the transistor 233, the gate of the transistor 234, and the gate of the transistor 235.

One end of the transistor 232 is connected to the power supply VD33, and the other end of the transistor 232 is connected to the other end of the transistor 136. The gate of the transistor 232 is connected to the output terminal of the inverter 242, the gate of the transistor 236, and the gate of the transistor 237.

One end of the transistor 233 is connected to the power supply VD33, and the other end of the transistor 233 is connected to the contact N1. The gate of the transistor 233 is connected to the signal terminal 241, the input terminal of the inverter 242, the gate of the transistor 234, the gate of the transistor 231, and the gate of the transistor 235.

One end of the transistor 234 is connected to the power supply VD33, and the other end of the transistor 234 is connected to the contact N3. The gate of the transistor 234 is connected to the signal terminal 241, the input terminal of the inverter 242, the gate of the transistor 233, the gate of the transistor 231, and the gate of the transistor 235.

One end of the transistor 235 is connected to ground, and the other end of the transistor 235 is connected to the other end of the resistor R1. The gate of the transistor 235 is connected to the signal terminal 241, the input terminal of the inverter 242, the gate of the transistor 231, the gate of the transistor 233, and the gate of the transistor 234.

One end of the transistor 236 is connected to ground, and the other end of the transistor 236 is connected to the other end of the transistor 132, the other end of the transistor 135, the gate of the transistor 135, the gate of the transistor 137, and the gate of the transistor 138. The gate of the transistor 236 is connected to the output terminal of the inverter 242, the gate of the transistor 237, and the gate of the transistor 232.

One end of the transistor 237 is connected to ground, and the other end of the transistor 237 is connected to the contact N2. The gate of the transistor 237 is connected to the output terminal of the inverter 242, the gate of the transistor 232, and the gate of the transistor 236.

When the transistors 231 to 234 are each a PMOS transistor while the transistors 235 to 237 are each an NMOS transistor, for example, the one end of each of the transistors 231 to 237 may be the source while the other end thereof may be the drain.

<Operation of Overvoltage Protection Circuit>

Figure 11:
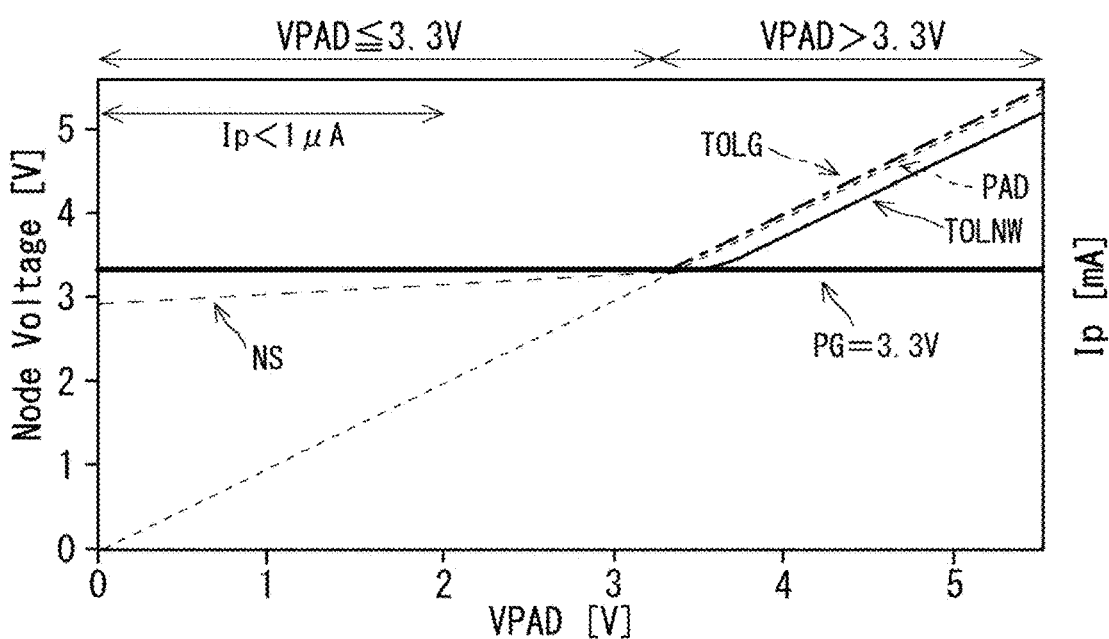
FIG. 11 is a graph illustrating an operation of the overvoltage protection circuit according to the second embodiment, where a horizontal axis represents a voltage applied to a CC terminal, a vertical axis on the left side represents a voltage, and a vertical axis on the right side represents a current.

Next, an operation of the overvoltage protection circuit will be described. FIG. 11 is a graph illustrating an operation of the overvoltage protection circuit according to the second embodiment, where a horizontal axis represents a voltage VPAD applied to a CC terminal, a vertical axis on the left side represents a voltage, and a vertical axis on the right side represents a current. An operation of the overvoltage protection circuit 200 in a case where the disabling function is invalidated is similar to the operation of the overvoltage protection circuit 100 according to the first embodiment, and therefore, description thereof is omitted.

As illustrated in FIG. 11, when the disabling function is validated, the input control circuit 230 fixes a voltage of the input wiring PG of the gate control circuit 120 to, for example, 3.3V that is the same as that of the power supply VD33 (PG=3.3V). As a result, when the voltage VPAD applied to the CC terminal 16 is equal to or lower than 3.3V, the gate control circuit 120 fixes the gate voltage and the back gate voltage of the transistor 112 for overvoltage protection in the current output circuit 110 to 3.3V. Accordingly, the current output circuit 110 stops outputting the current.

On the other hand, when the voltage VPAD applied to the CC terminal 16 is higher than 3.3V, the gate control circuit 120 controls the gate voltage and the back gate voltage of the transistor 112 in the current output circuit 110 via the gate wiring PGF (TOLG) and the back gate wiring (TOLNW) while following the voltage applied to the CC terminal 16. Therefore, the overvoltage protection circuit 100 can protect the current output circuit 110 from the overvoltage.

Next, an effect of the present embodiment will be described. When the disabling function is validated at the time of no usage of the current output circuit 110, the overvoltage protection circuit 200 according to the present embodiment can protect the transistor 111 from the over-voltage and suppress the operation current. On the other hand, when the disabling function is invalidated at the time of the usage of the current output circuit 110, the overvoltage protection circuit 200 can provide a similar effect to that of the overvoltage protection circuit 100 according to the first embodiment.

In the foregoing, the disclosed invention made by the present inventors has been concretely described on the basis of the embodiments. However, it is needless to say that the disclosed invention is not limited to the foregoing embodiments, and various modifications can be made within the scope of the present invention. For example, the disclosure can be changed to a CCPHY including the respective overvoltage protection circuits according to the first and second embodiments and a connector including the CCPHY. In the case, the CCPHY may be for the source of the Type-C connector in the USB, or may be compatible with the DRP of the Type-C connector in the USB. The respective overvoltage protection circuits according to the first and second embodiments may be applied to not only the Type-C connector in the USB but also a general connector or a semiconductor device including the connector. Further, the respective overvoltage protection circuits according to the first and second embodiments may be applied to not only the connector but also a semiconductor device including a terminal. Combination of components in the first and second embodiments is also within the scope of the technical idea.

What is claimed is:

1. An overvoltage protection circuit comprising:
   a current output circuit comprising a first transistor arranged between a power supply and a terminal and a second transistor arranged between the first transistor and the terminal, the current output circuit outputting current to the first transistor to be driven such that a current flows from the power supply; and
   a gate input circuit controlling a voltage of a gate and a voltage of a back gate of the second transistor,
   wherein the gate input circuit controls the voltage of the gate and the voltage of the back gate of the second transistor in response to a voltage applied to the terminal,
   wherein the current output circuit protects the first transistor from the voltage applied to the terminal under control of the second transistor,
   wherein the gate input circuit comprises:
      a gate control circuit controlling the voltage of the gate and the voltage of the back gate of the second transistor; and
      an input control circuit inputting an input voltage to the gate control circuit,
   wherein the input control circuit changes the input voltage in response to the voltage applied to the terminal,
   wherein the gate control circuit controls the voltage of the gate and the voltage of the back gate of the second transistor in response to the input voltage,
   wherein the input control circuit comprises:
      a bias circuit generating a reference current;
      a control circuit controlling the input voltage; and
      a disable circuit configured to disable the bias circuit and the control circuit, and
   wherein the disable circuit disables the bias circuit and the control circuit such that the input control circuit inputs the same voltage value as that of the power supply, as the input voltage.

2. The overvoltage protection circuit according to claim 1, wherein the input control circuit is configured to;

input a first input voltage as the input voltage to the gate control circuit when a first voltage equal to or lower than a predetermined threshold value is applied to the terminal, and input a second input voltage as the input voltage to the gate control circuit when a second voltage higher than the predetermined threshold value is applied to the terminal, and wherein the gate control circuit is configured to:

when receiving the first input voltage as input, control the gate of the second transistor such that the current output circuit outputs the current to the terminal, and, when receiving the second input voltage as input, control the gate of the second transistor to protect the current output circuit.

3. The overvoltage protection circuit according to claim 2, wherein the predetermined threshold value is the same voltage value as that of the voltage of the power supply.

4. The overvoltage protection circuit according to claim 2, wherein the current output circuit further comprises a third transistor, wherein one end of the first transistor is connected to the power supply, wherein other end of the first transistor is connected to one end of the second transistor, wherein a gate of the first transistor is connected to a gate of the third transistor, wherein the one end of the second transistor is connected to the other end of the first transistor, wherein other end of the second transistor is connected to the terminal, wherein a gate and a back gate of the second transistor are connected to the gate control circuit, wherein one end of the third transistor is connected to the power supply, wherein other end of the third transistor is connected to a wiring through which a reference current flows, and wherein the gate of the third transistor is connected to gate of the first transistor.

5. The overvoltage protection circuit according to claim 4, wherein the first transistor, the second transistor, and the third transistor are each a PMOS transistor, wherein the one end of each of the first transistor, the second transistor, and the third transistor is a source, and wherein the other end of each of the first transistor, the second transistor, and the third transistor is a drain.

6. The overvoltage protection circuit according to claim 2, further comprising:

a terminal wiring connected to the terminal;

an input wiring to which the input voltage is input from the input control circuit;

a gate wiring connected to the gate of the second transistor; and a back gate wiring connected to the back gate of the second transistor, wherein the input control circuit is configured to input at least either one of the first input voltage and the second input voltage to the gate control circuit via the input wiring, and wherein the gate control circuit is configured to control the gate via the gate wiring and the back gate wiring.

7. The overvoltage protection circuit according to claim 6, wherein the gate control circuit comprises:

a first gate control transistor;

a second gate control transistor;

a third gate control transistor;

a fourth gate control transistor; and a fifth gate control transistor, wherein one end of the first gate control transistor is connected to the input wiring, wherein other end of the first gate control transistor is connected to the gate wiring, wherein a gate of the first gate control transistor is connected to the terminal wiring, wherein a back gate of the first gate control transistor is connected to the back gate wiring, wherein one end of the second gate control transistor is connected to the gate wiring, wherein other end of the second gate control transistor is connected to the terminal wiring, wherein a gate of the second gate control transistor is connected to the power supply, wherein a back gate of the second gate control transistor is connected to the back gate wiring, wherein one end of the third gate control transistor is connected to the power supply, wherein other end of the third gate control transistor is connected to the back gate wiring, wherein a gate of the third gate control transistor is connected to the terminal wiring, wherein a back gate of the third gate control transistor is connected to the back gate wiring, wherein one end of the fourth gate control transistor is connected to the input wiring, wherein other end of the fourth gate control transistor is connected to the gate wiring, wherein a gate of the fourth gate control transistor is connected to the gate wiring, wherein a back gate of the fourth gate control transistor is connected to the back gate wiring, wherein one end of the fifth gate control transistor is connected to the gate wiring, wherein other end of the fifth gate control transistor is connected to the input wiring, wherein a gate of the fifth gate control transistor is connected to the power supply, and wherein a back gate of the fifth gate control transistor is connected to the input wiring.

8. The overvoltage protection circuit according to claim 7, wherein the first gate control transistor, the second gate control transistor, the third gate control transistor, and the fourth gate control transistor are each a PMOS transistor, wherein the fifth gate control transistor is an NMOS transistor, wherein the one end of each of the first gate control transistor, the second gate control transistor, the third gate control transistor, the fourth gate control transistor, and the fifth gate control transistor is a source, and wherein the other end of each of the first gate control transistor, the second gate control transistor, the third gate control transistor, the fourth gate control transistor, and the fifth gate control transistor is a drain.

9. The overvoltage protection circuit according to claim 6, wherein the input control circuit comprises:

a first input control transistor;

a second input control transistor;

a third input control transistor;

a fourth input control transistor;

a fifth input control transistor;

a sixth input control transistor;

a seventh input control transistor;

an eighth input control transistor;

a ninth input control transistor;

a resistor;

a first contact;

a second contact; and a third contact, wherein one end of the first input control transistor is connected to the power supply, wherein other end of the first input control transistor is connected to one end of the resistor, a gate of the first input control transistor, a gate of the second input control transistor, and a gate of the fourth input control transistor, wherein the gate of the first input control transistor is connected to other end of the first input control transistor, the gate of the second input control transistor, the gate of the fourth input control transistor, and the one end of the resistor, wherein the one end of the resistor is connected to the other end of the first input control transistor, the gate of the first input control transistor, the gate of the second input control transistor, and the gate of the fourth input control transistor, wherein other end of the resistor is connected to ground, wherein one end of the second input control transistor is connected to the power supply, wherein other end of the second input control transistor is connected to one end of the fifth input control transistor, a gate of the fifth input control transistor, a gate of the seventh input control transistor, and a gate of the eighth input control transistor, wherein the gate of the second input control transistor is connected to the gate of the first input control transistor, the other end of the first input control transistor, the one end of the resistor, and the gate of the fourth input control transistor, wherein one end of the third input control transistor is connected to the power supply, wherein other end of the third input control transistor is connected to the second contact, wherein a gate of the third input control transistor is connected to the first contact, wherein one end of the fourth input control transistor is connected to the power supply, wherein other end of the fourth input control transistor is connected to the third contact, wherein the gate of the fourth input control transistor is connected to the gate of the first input control transistor, the other end of the first input control transistor, the one end of the resistor, and the gate of the second input control transistor, wherein one end of the fifth input control transistor is connected to the ground, wherein other end of the fifth input control transistor is connected to other end of the second input control transistor, a gate of the fifth input control transistor, a gate of the seventh input control transistor, and a gate of the eighth input control transistor, wherein the gate of the fifth input control transistor is connected to the other end of the second input control transistor, the other end of the fifth input control transistor, the gate of the seventh input control transistor, and the gate of the eighth input control transistor, wherein one end of the sixth input control transistor is connected to other end of the seventh input control transistor and the first contact, wherein other end of the sixth input control transistor is connected to the power supply, wherein a gate of the sixth input control transistor is connected to the terminal wiring, wherein a back gate of the sixth input control transistor is connected to the first contact, wherein one end of the seventh input control transistor is connected to the ground, wherein the other end of the seventh input control transistor is connected to the one end of the sixth input control transistor and the first contact, wherein the gate of the seventh input control transistor is connected to the other end of the second input control transistor, the other end of the fifth input control transistor, the gate of the fifth input control transistor, and the gate of the eighth input control transistor, wherein one end of the eighth input control transistor is connected to the ground, wherein other end of the eighth input control transistor is connected to the second contact, wherein the gate of the eighth input control transistor is connected to the other end of the second input control transistor, the other end of the fifth input control transistor, the gate of the fifth input control transistor, and the gate of the seventh input control transistor, wherein one end of the ninth input control transistor is connected to the ground, wherein other end of the ninth input control transistor is connected to the third contact, wherein a gate of the ninth input control transistor is connected to the second contact, wherein the first contact is connected to the back gate of the sixth input control transistor, the one end of the sixth input control transistor, the other end of the seventh input control transistor, and the gate of the third input control transistor, wherein the second contact is connected to the other end of the third input control transistor, the other end of the eighth input control transistor, and the gate of the ninth input control transistor, and wherein the third contact is connected to the other end of the fourth input control transistor, the other end of the ninth input control transistor, and the input wiring.

10. The overvoltage protection circuit according to claim 9, wherein the first input control transistor, the second input control transistor, the third input control transistor, and the fourth input control transistor are each a PMOS transistor, wherein the fifth input control transistor, the sixth input control transistor, the seventh input control transistor, the eighth input control transistor, and the ninth input control transistor are each an NMOS transistor, wherein the one end of each of the first input control transistor, the second input control transistor, the third input control transistor, the fourth input control transistor, the fifth input control transistor, the sixth input control transistor, the seventh input control transistor, the eighth input control transistor, and the ninth input control transistor is a source, and wherein the other end of each of the first input control transistor, the second input control transistor, the third input control transistor, the fourth input control transistor, the fifth input control transistor, the sixth input control transistor, the seventh input control transistor, the eighth input control transistor, and the ninth input control transistor is a drain.

11. The overvoltage protection circuit according to claim 9, wherein the disable circuit comprises:
   a signal terminal to which an enable signal is input;
   an inverter;
   a first disable transistor;
   a second disable transistor;
   a third disable transistor;
   a fourth disable transistor;
   a fifth disable transistor;
   a sixth disable transistor; and
   a seventh disable transistor,
   wherein an input terminal of the inverter is connected to the signal terminal, a gate of the first disable transistor, a gate of the third disable transistor, a gate of the fourth disable transistor, and a gate of the fifth disable transistor,
   wherein an output terminal of the inverter is connected to a gate of the second disable transistor, a gate of the sixth disable transistor, and a gate of the seventh disable transistor,
   wherein one end of the first disable transistor is connected to the power supply,
   wherein the other end of the first disable transistor is connected to the one end of the resistor, the other end of the fifth input control transistor, the gate of the first input control transistor, the gate of the second input control transistor, and the gate of the fourth input control transistor,
   wherein the gate of the first disable transistor is connected to the signal terminal, the input terminal of the inverter, the gate of the third disable transistor, the gate of the fourth disable transistor, and the gate of the fifth disable transistor,
   wherein one end of the second disable transistor is connected to the power supply,
   wherein the other end of the second disable transistor is connected to the other end of the sixth input control transistor,
   wherein the gate of the second disable transistor is connected to the output terminal of the inverter, the gate of the sixth disable transistor, and the gate of the seventh disable transistor,
   wherein one end of the third disable transistor is connected to the power supply,
   wherein the other end of the third disable transistor is connected to the first contact,
   wherein the gate of the third disable transistor is connected to the signal terminal, the input terminal of the inverter, the gate of the first disable transistor, the gate of the fourth disable transistor, and the gate of the fifth disable transistor,
   wherein one end of the fourth disable transistor is connected to the power supply,
   wherein the other end of the fourth disable transistor is connected to the third contact,
   wherein the gate of the fourth disable transistor is connected to the signal terminal, the input terminal of the inverter, the gate of the first disable transistor, the gate of the third disable transistor, and the gate of the fifth disable transistor,
   wherein one end of the fifth disable transistor is connected to the ground, wherein the other end of the fifth disable transistor is connected to the other end of the resistor,
   wherein the gate of the fifth disable transistor is connected to the signal terminal, the input terminal of the inverter, the gate of the first disable transistor, the gate of the third disable transistor, and the gate of the fourth disable transistor,
   wherein one end of the sixth disable transistor is connected to the ground,
   wherein the other end of the sixth disable transistor is connected to the other end of the second input control transistor, the other end of the fifth input control transistor, the gate of the fifth input control transistor, the gate of the seventh input control transistor, and the gate of the eighth input control transistor,
   wherein the gate of the sixth disable transistor is connected to the output terminal of the inverter, the gate of the second disable transistor, and the gate of the seventh disable transistor,
   wherein one end of the seventh disable transistor is connected to the ground,
   wherein the other end of the seventh disable transistor is connected to the second contact, and
   wherein the gate of the seventh disable transistor is connected to the output terminal of the inverter, the gate of the second disable transistor, and the gate of the sixth disable transistor.

12. The overvoltage protection circuit according to claim 11, wherein the first disable transistor, the second disable transistor, the third disable transistor, and the fourth disable transistor are each a PMOS transistor,
   wherein the fifth disable transistor, the sixth disable transistor, and the seventh disable transistor are each an NMOS transistor,
   wherein the one end of each of the first disable transistor, the second disable transistor, the third disable transistor, and the fourth disable transistor, the fifth disable transistor, the sixth disable transistor, and the seventh disable transistor is a source, and
   wherein the other end of each of the first disable transistor, the second disable transistor, the third disable transistor, the fourth disable transistor, the fifth disable transistor, the sixth disable transistor, and the seventh disable transistor is a drain.

13. A connector comprising:
   a Type-C compatible physical layer (CCPHY),
   wherein the CCPHY comprises an overvoltage protection circuit,
   wherein the overvoltage protection circuit comprises:
      a current output circuit comprising a first transistor arranged between a power supply and a terminal and a second transistor arranged between the first transistor and the terminal, the current output circuit outputting the current to the first transistor to be driven such that a current flows from the power supply;
      a gate input circuit controlling a voltage of a gate and a voltage of a back gate of the second transistor,
      wherein the gate input circuit controls the voltage of the gate and the voltage of the back gate of the second transistor in response to a voltage applied to the terminal, and
      wherein the current output circuit protects the first transistor from the voltage applied to the terminal under control of the second transistor, wherein the gate input circuit comprises:

a gate control circuit controlling the voltage of the gate and the voltage of the back gate of the second transistor; and an input control circuit inputting an input voltage to the gate control circuit, wherein the input control circuit changes the input voltage in response to the voltage applied to the terminal, wherein the gate control circuit controls the voltage of the gate and the voltage of the back gate of the second transistor in response to the input voltage, wherein the input control circuit comprises:

a bias circuit generating a reference current;

a control circuit controlling the input voltage; and a disable circuit configured to disable the bias circuit and the control circuit, and wherein the disable circuit disables the bias circuit and the control circuit such that the input control circuit inputs the same voltage value as that of the power supply, as the input voltage.

14. The connector according to claim 13, wherein the CCPHY is for a source of a Type-C connector in a universal serial bus.

15. The connector according to claim 13, wherein the CCPHY is compatible with dual role power (DRP) of a Type-C connector in a universal serial bus.

16. A semiconductor device comprising:

an overvoltage protection circuit, wherein the overvoltage protection circuit comprises:

a current output circuit comprising a first transistor arranged between a power supply and a terminal and a second transistor arranged between the first transistor and the terminal, the current output circuit outputting the current to the first transistor to be driven such that a current flows from the power supply; and a gate input circuit controlling a voltage of a gate and a voltage of a back gate of the second transistor, wherein the gate input circuit controls the voltage of the gate and the voltage of the back gate of the second transistor in response to a voltage applied to the terminal, and wherein the current output circuit protects the first transistor from the voltage applied to the terminal under control of the second transistor, wherein the gate input circuit comprises:

a gate control circuit controlling the voltage of the gate and the voltage of the back gate of the second transistor; and an input control circuit inputting an input voltage to the gate control circuit, wherein the input control circuit changes the input voltage in response to the voltage applied to the terminal, and wherein the gate control circuit controls the voltage of the gate and the voltage of the back gate of the second transistor in response to the input voltage, wherein the input control circuit comprises:

a bias circuit generating a reference current;

a control circuit controlling the input voltage; and a disable circuit configured to disable the bias circuit and the control circuit, and wherein the disable circuit disables the bias circuit and the control circuit such that the input control circuit inputs the same voltage value as that of the power supply, as the input voltage.

* * * * *